Figure 1:
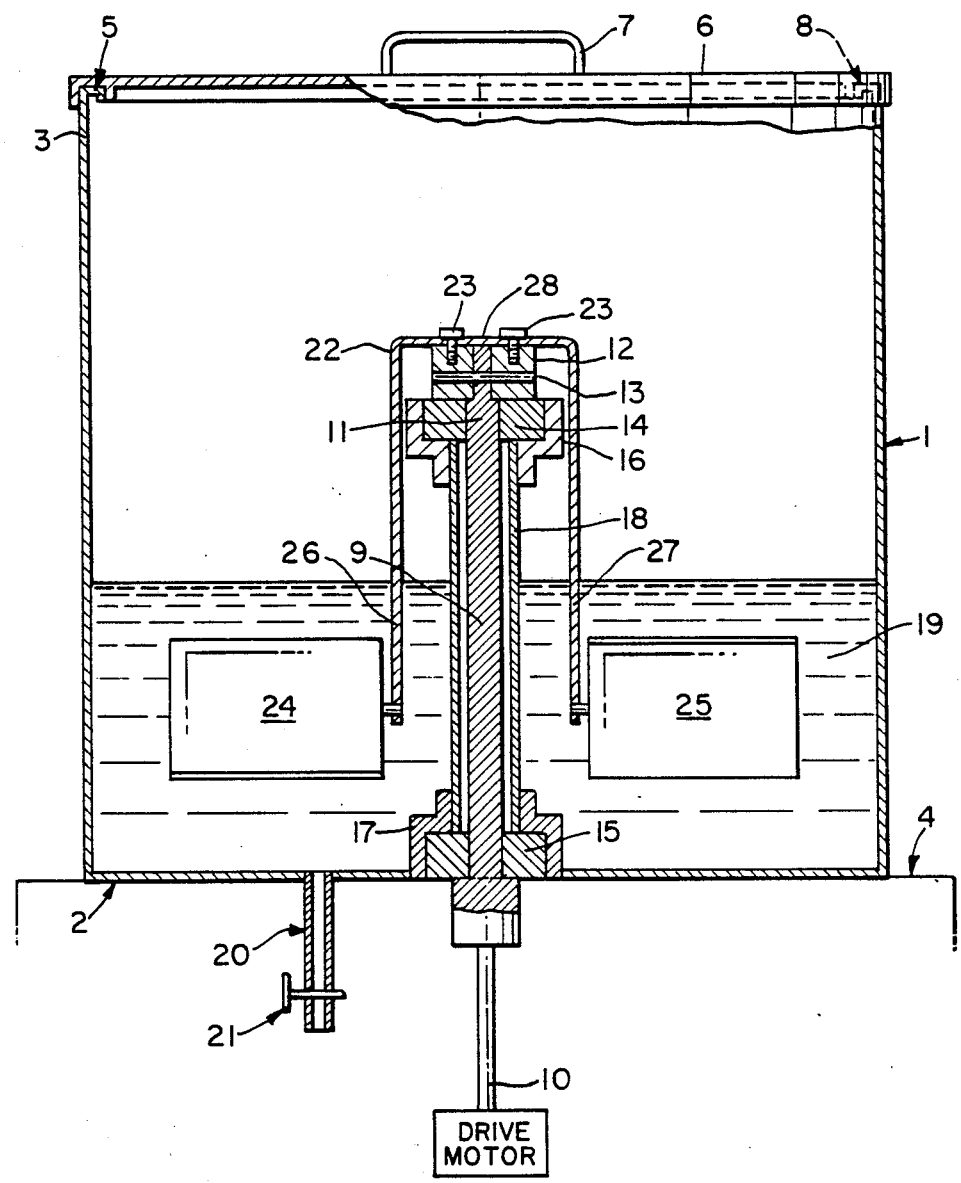

United States Patent [19]

Niblett et al.

[11] Patent Number: 4,895,177
[45] Date of Patent: Jan. 23, 1990

[54] CIRCUIT BOARD CLEANING APPARATUS

[75] Inventors: Andrew F. Niblett; Martyn K. Freeman, both of Bristol, United Kingdom

[73] Assignee: British Aerospace Public Limited Company, London, England

[21] Appl. No.: 869,613

[22] Filed: Jun. 2, 1986

[30] Foreign Application Priority Data

Jun. 1, 1985 [GB] United Kingdom ............... 8513879

[51] Int. Cl.⁴ .............................................. B08B 3/04
[52] U.S. Cl. .................................. 134/140; 134/157; 134/158; 134/164
[58] Field of Search ............... 366/332, 278, 277, 289; 134/140, 149, 147, 156, 157, 158, 86, 137, 87, 200, 89, 187, 161, 163, 164; 68/154, 198; 354/315, 326, 328, 329, 330, 337, 347

[56] References Cited

U.S. PATENT DOCUMENTS

| 281,598 | 7/1883 | Wiseman | 134/158 |
|---|---|---|---|
| 1,390,520 | 9/1921 | Fay | 366/332 |
| 1,925,154 | 9/1933 | Saffir | 134/157 |
| 2,563,046 | 8/1951 | Killin | 68/154 X |
| 3,096,774 | 7/1963 | Rand . | |
| 3,116,745 | 1/1964 | Burning | 134/158 |
| 3,596,585 | 3/1969 | Lewandowski | 354/337 X |
| 3,860,021 | 1/1975 | Saric | 134/158 |
| 3,868,272 | 3/1973 | Tardoskegyi . | |
| 4,112,454 | 9/1978 | Harvey | 134/157 |
| 4,201,374 | 5/1980 | Gras . | |
| 4,316,750 | 1/1981 | Gengler . | |
| 4,331,230 | 5/1982 | Buckley | 134/135 X |
| 4,427,019 | 8/1982 | Eidschun . | |
| 4,519,846 | 5/1985 | Aigo | 134/199 |

FOREIGN PATENT DOCUMENTS

| 0104633 | 4/1984 | European Pat. Off. . | |
| 509437 | 10/1930 | Fed. Rep. of Germany | 134/157 |
| 3429756AL | 3/1985 | Fed. Rep. of Germany . | |
| 2103865 | 4/1972 | France . | |
| 299082 | 10/1928 | United Kingdom | 354/329 |
| 2042208A | 9/1980 | United Kingdom . | |

OTHER PUBLICATIONS

Technical Digest–Western Electric, No. 65, Jan. 1982, pp. 7–8, "System for Cleaning Contact Fingers".

Primary Examiner—Frankie L. Stinson
Attorney, Agent, or Firm—Cushman, Darby & Cushman

[57] ABSTRACT

Known methods of remaining flux from printed circuit boards include spraying jets of solvent onto the board and/or immersing the board in solvent. However, these techniques are not effective when applied to ceramic boards comprising ceramic chip carries as the spacing between the board and the carries is much smaller than with printed circuit boards. Described herein is apparatus for effecting the removal of flux by immersing the boards in solvent and agitating them in the solvent so that the solvent can penetrate the spaces between the components or carriers and the board.

9 Claims, 2 Drawing Sheets

CIRCUIT BOARD CLEANING APPARATUS

This invention relates to circuit board cleaning apparatus and is more particularly although not exclusively concerned with the cleaning of boards comprising chip carrier circuits.

Standard printed circuit board cleaning techniques for removing flux include spraying jets off solvent onto the board and/or immersing the board in solvent. These techniques are effective for removing flux as the spacing between the components on the board and the board itself is approximately 0.5–2.0 mm, and the solvent can penetrate these spaces easily. However, when these same techniques are applied to ceramic boards comprising ceramic chip carriers, the solvent cannot penetrate the smaller spacing i.e. 20–50 μm, between the carriers and the board to remove the flux. In addition to the smaller spacing, the solder pads to which the carriers are attached form an effective cage around each carrier extending on all four sides, and therefore making it difficult to remove flux from under the carriers.

It could be possible to raise the chip carriers to create a larger spacing between the carriers and the board but other problems may be obtained e.g. reduced thermal conductivity between the carriers and the board.

According to one aspect of the invention, there is provided circuit board cleaning apparatus for cleaning a circuit board, said apparatus including:

container means for containing cleaning liquid;

carrying means for locating and carrying a circuit board in an immersed condition in said cleaning liquid;

agitation means for effecting relative agitation of the carrying means and the cleaning fluid whereby the liquid is caused to penetrate otherwise obscured portions of the board thereby cleaning said obscured portions.

Preferably, said carrying means are movably mounted with respect to said container means and said agitation means includes drive means for effecting agitation motion of said carrying means.

Advantageously, said agitation, motion is rotational and reciprocal.

Figure 2:
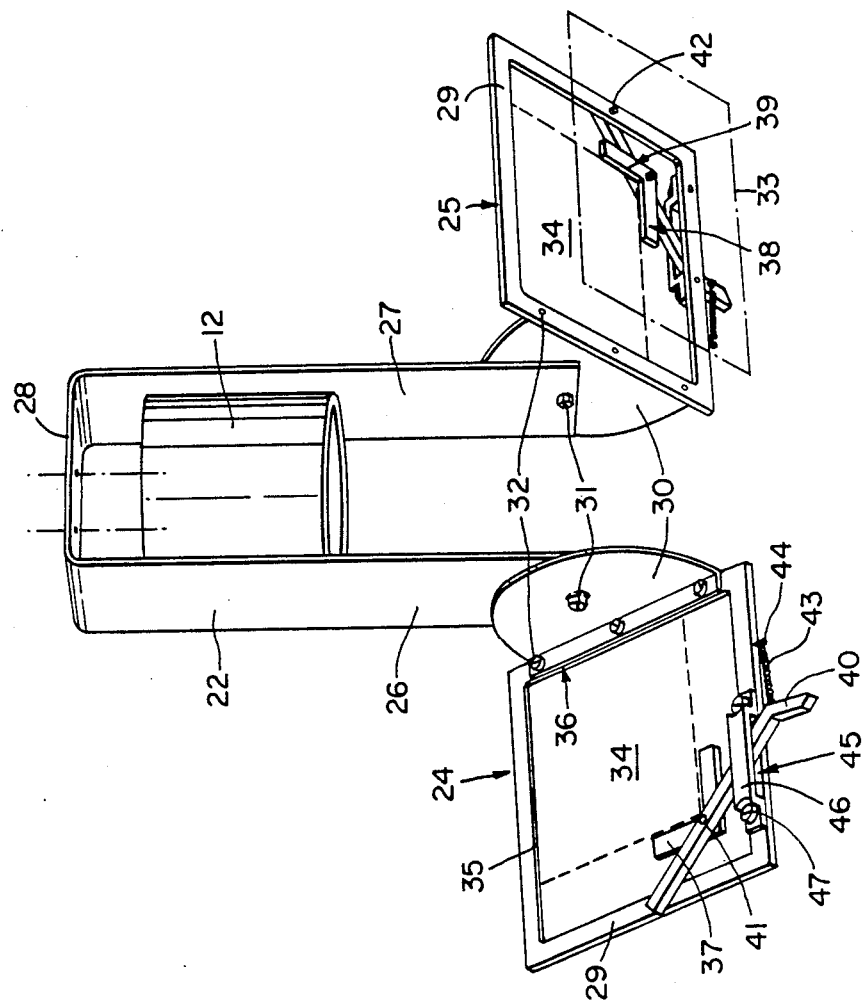

These and other aspects of the invention will now be described by way of example, with reference to the accompanying drawings in which:

FIG. 1 is a sectional side elevation of cleaning apparatus for removing flux from chip carrier circuits; and FIG. 2 is a circuit board mounting arrangement used in the FIG. 1 apparatus.

The cleaning apparatus shown in FIG. 1 comprises a cylindrical tank 1 having a base portion 2 and a cylindrical wall 3, mounted on a plinth 4. A circular lip region 5 is formed at the top end of the wall 3 of the tank 1, the tank having a circular lid 6 which has a handle 7 and a circular groove 8 formed on it. The groove 8 is intended to engage with the lip 5 to form a seal between the tank wall 3 and the lid 6. The base portion 2 of the tank 1 and the plinth 4 are adapted so that a drive shaft 9 extends upwards into the tank, the lower end 10 of the shaft being connected to a motor (shown schematically in FIG. 1 mounted within the plinth 4). The upper end 11 of the shaft is fixed to a collar 12 by means of a pin 13 which passes through both the shaft 9 and the collar 12. The shaft 9 is mounted in a pair of bearings, 14 and 15, one bearing 14 at its upper end 11 and the other bearing 15 near the base 2 of the tank 1, and can rotate relative to the tank. The bearings 14 and 15 are housed in bearing housings 16 and 17 respectively which are spaced apart by a tube 18. The tube 18 forms a protective casing for the shaft 9 and is sealed at either end to respective bearing housings 16 and 17. The lower bearing housing 17 is sealed to the base 2 of the tank to prevent any leakage of solvent 19 contained within the tank. The base 2 and plinth 4 are also modified to receive a drain pipe 20 which has a drain tap 21. The drain pipe 20 enables solvent 19 to be easily removed from the tank 1 and replaced. A carousel 22 is attached to the collar 12 by means of two screws 32, and it is driven by the shaft 9. The carousel 22 is U-shaped and has two circuit board mounting arrangements 24 and 25 at the end of each arm 26 and 27 respectively, the flat portion 28 of the U-shape being in contact with the collar 12 and the shaft 9 with the arms 26 and 27 pointing downwards into the solvent 19. The amount of solvent 19 contained in the tank 1 is sufficient to cover the mounting arrangements 24 and 25 of the carousel 22.

The carousel 22 is shown in more detail in FIG. 2. The mounting arrangements 24, 25 are identical and each comprises a rectangular frame member 29, a mounting plate 30 attached to respective arms 26, 27 by means of a nut and bolt 31 and to respective frame members 29 by means of three screws 32, and a circuit board retaining assembly shown generally at 33. Each circuit board 34 is retained in grooves 35, 36 formed in two adjacent sides of the frame member 29, by the assembly 33, which consists of a right-angled member 37 having grooves 38, 39 attached to a lever arm 40 by a pivot pin 41. The arm 40 is attached to the frame member 29 by a second pivot pin 42 at one end and to a spring 43 at its other end, the spring 43 being attached to the frame member 29 by a pin 44. The arm 40 slides within a slot 45 defined by the frame member 29 and a channel member 46 which is attached to the frame member 29 by means of two screws 47, the boards 34 being retained in the frame member 29 by the member 37 against the action of the spring 43.

Each assembly 33 is adjustable so that the mounting arrangements 24, 25 can accommodate a range of different board sizes. The arrangements 24, 25 are angularly adjustable with respect to the arms 26, 27 so that a preferred angle at which the boards 34 are mounted can be presented to the solvent 19.

When the apparatus is in operation, the motor (not shown) provides a reciprocatory angular drive motion for the drive shaft 9 during the agitation period, the motion being transmitted to the boards 34 via the collar 12 and the carousel 22. The angle of motion of the boards relative to the tank 1 is approximately 160° with the change in direction of motion occurring once every second. The boards 34 are held at an angle to the direction of motion with the face of the board being pushed through the solvent on every other change in direction of motion, this angle being between 30° and 45° . The motion of the boards within the solvent 19 forces the solvent under the carriers to attack the flux hidden there. For example, for a board on which flux thinners ESL Type 600 is used on the solder pads to hold the carriers onto the board while the solder is made to flow in a vapour phase machine, the flux remaining on the board can be effectively removed using a solvent PC81 at room temperature with the board mounted at an angle of 45° to the direction of motion, the board being agitated for 15 minutes.

Naturally, a larger carousel may be used which is able to carry a greater number of boards, but as the number of boards increases the diameter of the tank would have to be increased to accommodate them. In such cases, the drive mechanism in the centre of the tank 1 may be covered by a casing having a larger diameter than the tube 18 so that the boards are agitated in an annular section. This also reduces the amount of solvent 19 required.

It may be possible to mount boards back-to-back so that both directions of the reciprocatory motion are fully utilised in the cleaning process. Alternatively, the mounting arrangement for the boards may be such that the face of the board is altered so that it is pushed through the solvent on every change in direction of motion, thereby possibly shortening the agitation period required.

It may be necessary to incorporate vanes on the internal tank wall to produce more turbulence as the boards are moved through the solvent.

A heater may also be incorporated in the tank if a temperature greater than room temperature is required for the solvent to clean the boards.

We claim:

1. Circuit board cleaning apparatus for cleaning a circuit board, said apparatus including:
   container means for containing a cleaning liquid;
   carrying means for locating and carrying a circuit board in an immersed condition in a cleaning liquid disposed within said container means;
   agitation means for effecting relative reciprocal rotational motion of the carrying means and the cleaning liquid;
   said carrying means comprising means for mounting a circuit board by its edges with its face presented to the cleaning liquid at a selected angle of inclination to the direction of motion whereby the face is pushed through the cleaning liquid at least during one direction of motion and the cleaning liquid is caused to penetrate otherwise obscure portions of the board thereby cleaning said obscured portions.

2. Circuit board cleaning apparatus according to claim 1, wherein said carrying means are movably mounted with respect to said container means and said agitation means includes drive means for effecting agitation motion of said carrying means.

3. Circuit board cleaning apparatus according to claim 2, wherein said carrying means includes a rectangular frame element comprising two adjacent internal surfaces for locating respective two adjacent sides of a rectangular circuit board, abutment means for abutting the remaining two sides of said circuit board, and clamping means movable relative to said frame element for clamping said board.

4. Circuit board cleaning apparatus according to claim 3, wherein said clamping means includes two generally perpendicular abutment edges and bias means for biassing said clamping means into engagement with said circuit board.

5. Apparatus according to claim 2, wherein said carrying means is adapted to locate and carry a plurality of circuit boards in an immersed condition in said cleaning liquid.

6. Circuit board cleaning apparatus according to claim 1, wherein said carrying means is adapted to allow said selected angle to be adjusted.

7. A circuit board cleaning apparatus according to claim 1, wherein said carrying means is adjustable so that circuit boards of varying sizes can be carried therewith.

8. The apparatus defined in claim 1 wherein the angle is in the range of 30° to 45°.

9. The apparatus defined in claim 1 wherein the carrying means mounts a circuit board with its face disposed generally radially as respects the rotational motion.

* * * * *